United States Patent [19]
Klein et al.

[11] Patent Number: 4,934,943
[45] Date of Patent: Jun. 19, 1990

[54] AUTOMATED CONNECTOR ALIGNMENT ASSEMBLY FOR CONNECTION OF PRINTED CIRCUIT BOARDS

[75] Inventors: Frank H. Klein; Steven F. Selby, both of Huntsville, Ala.

[73] Assignee: Acustar, Inc., Troy, Mich.

[21] Appl. No.: 350,995

[22] Filed: May 12, 1989

[51] Int. Cl.$^5$ .............................................. H01R 9/09
[52] U.S. Cl. ...................................... 439/65; 439/77; 439/248; 439/547; 29/834; 29/840
[58] Field of Search ................. 29/830, 832, 834, 836, 29/838, 840, 841; 439/65, 76–80, 247, 248, 544, 547, 571

[56] References Cited
U.S. PATENT DOCUMENTS
4,811,165 3/1989 Currie et al. ........................... 439/77

Primary Examiner—P. Austin Bradley
Attorney, Agent, or Firm—Edward A. Craig

[57] ABSTRACT

A connection assembly for allowing automated circuit connections between perpendicularly disposed first and second printed circuit boards. A receptacle with connection sockets is operably connected with the first circuit board and attached at a first predetermined position on the first circuit board. A plug member which has connection blades compatible with sockets of the receptacle is attached to the second circuit board. The plug has laterally spaced alignment blades which extend from it. The receptacle includes spaced arms which cooperate with the alignment blade for automatically orienting the plug such that the connection blades are in alignment with the receiving sockets when the first printed circuit board is brought together with the second printed circuit board during assembly. A method of automated connection assembly of perpendicularly disposed circuit boards is also disclosed.

8 Claims, 3 Drawing Sheets

AUTOMATED CONNECTOR ALIGNMENT ASSEMBLY FOR CONNECTION OF PRINTED CIRCUIT BOARDS

BACKGROUND OF THE INVENTION

1. FIELD OF THE INVENTION

The present invention relates to a connector assembly for automated connection of printed circuit (PC) boards in an electrical device such as a vehicle radio.

2. DESCRIPTION OF RELATED ART

It has been a goal in the art to produce PC board connection assemblies which lend themselves to assembly by automation. While some assemblies of vehicle radios have been adapted to assembly by automation certain functions still require hand assembly, which is cumbersome and time consuming. For instance one of the problems with modern radios is that a horizontal main PC board must be connected to a generally vertical escutcheon PC board to provide circuitry connections between the boards. In the past, this has been accomplished by connectors which needed alignment and connection by hand.

It is, therefore, an object of the present invention to provide a connector assembly which will lend itself to automation in the function of connecting the escutcheon or key board PC circuit board of the radio with the main PC board.

It is still further, an object of the present invention to provide a self-aligned connection assembly such that when perpendicularly disposed circuit boards are moved toward each other in aligned position the connection between the circuit boards is automatically aligned and connected.

SUMMARY OF THE INVENTION

Therefore, in accordance with these objectives, provided in the present invention is a connection assembly for connecting a first circuit board with a second circuit board which are disposed perpendicularly to one another. The connection assembly comprises a receptacle which includes connection receiving sockets operably connected to a circuit of the first circuit board. A means for attaching the receptacle in a predetermined position on the first circuit board is also provided. A cable assembly plug which includes connection blade portions compatible with the sockets of the receptacle is provided and also has a means for attaching the cable assembly plug to the second circuit board in a predetermined cooperating position which is substantially aligned with the position of the receptacle. Alignment blade members are provided which extend from the cable assembly plug substantially parallel to the plane of the main circuit board. A means is associated with the receptacle for receiving the alignment blade means for automatically orienting the plug such that the connection portions and the receiving sockets are in alignment when the first circuit board is brought together with the second circuit board during assembly thereof.

Additional benefits and advantages of the present invention will become apparent to those skilled in the art from the subsequent description of the invention and the appended claims taken in conjunction with the accompanying drawings.

DESCRIPTION OF THE PREFERRED EMBODIMENT

Figure 1:
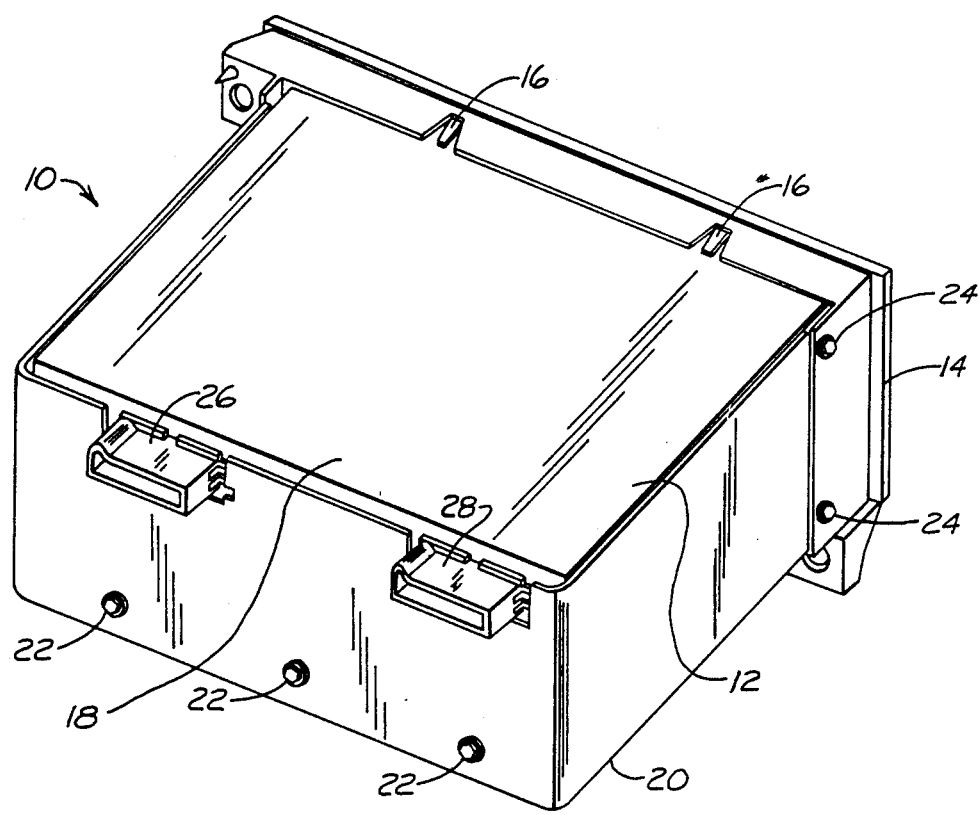
FIG. 1 is a perspective view showing a rearward and top view of a partially assembled vehicle radio.
Figure 2:
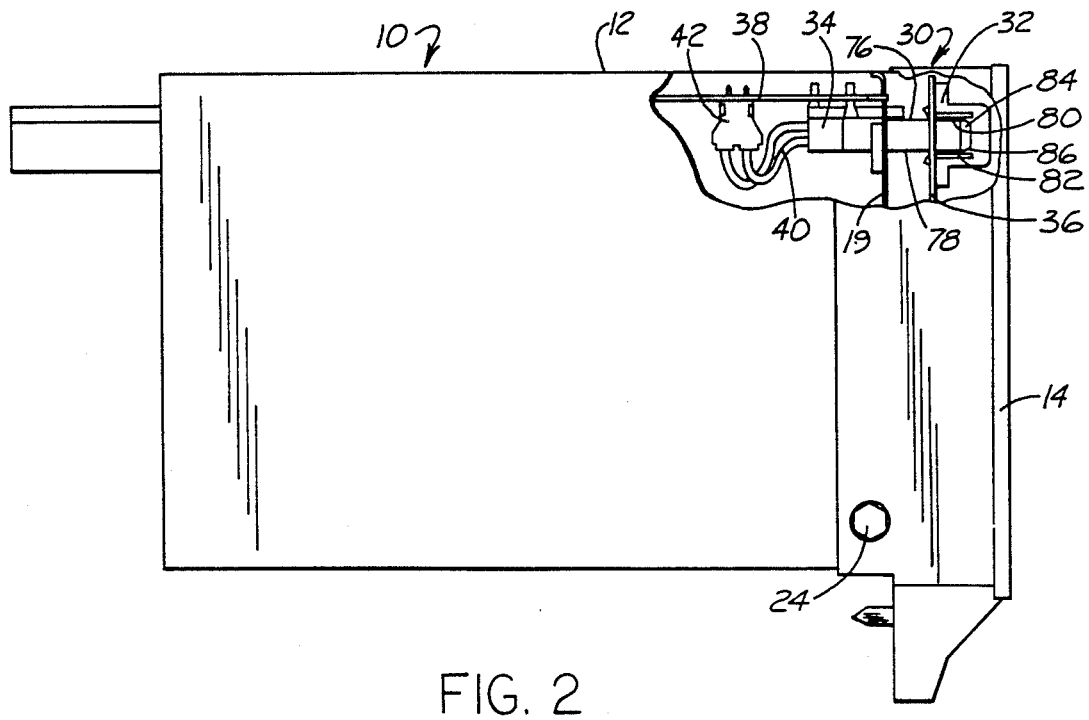
FIG. 2 is a side view of the partially assembled radio of FIG. 1 partially broken away, showing the connector assembly of the present invention.

Referring now to the Figures, the present invention is operable in the illustrated partially assembled vehicle radio 10. The partially assembled vehicle radio 10 includes a body portion 12 and on Escutcheon face plate 14 connected to the body portion by way of bolts 22. The body 12 of the partially assembled radio 10 includes a top plate 18 to which the main PC circuit board is connected and a wall 19 disposed perpendicularly to the top 18. Wall 19 includes cut-out portion 21 defining an opening through which the connection of the present invention is facilitated. A u-shaped frame 20 supports the body 12 of the radio by way of bolts 22 and is also connected to the face plate 14 through bolts 24. Interfaces 26 and 28 are provided for connection of speaker cables and the like to the partially assembled radio 10. The connector assembly of the present invention is generally shown at 30 in FIG. 2.

According to the present invention connector assembly 30 includes a receptacle 32 and a cable assembly plug 34. The receptacle 32 is connected to the escutcheon PC board 36 of the partially assembled radio 10 by way of soldering the receptacle 32 into the circuit of the board. The receptacle 32 includes a plurality of sockets 44 which are connected to the PC board 38 by way of associated pins 46. Pins 46 are soldered into the circuit by conventional means to attach the receptacle 32 to the escutcheon board 36. Slots 47 and 48 are provided in the escutcheon circuit board. The receptacle 32 includes pairs of spaced locking arms (50,52 and 54,56) which are flexible arms such that when connector 32 is inserted into circuit board 36 the locking end portions flex into slots 47 and 48 to hold the connector in position during soldering to the circuit board 36. The escutcheon circuit board 36 also includes a plurality of connection apertures 49 corresponding to the sockets 44 of the receptacle for allowing entry of electrical connection blades or pins into the sockets 49.

The cable assembly plug 34 is connected to the main circuit board 38 by way of cable assembly 40 and plug 42 which plugs into the circuits of the main PC board 38. The cable assembly plug 34 includes connection blades 56 which connect with the sockets 44 of connector 32 to provide connection between the main circuit board and the escutcheon circuit board in the radio.

Preferably, the body of the plug 34 and the receptacle 32 are made from a suitable plastic material such as a glass filled polyester resin. The electrical portions of the receptacle 32 and plug 34 are produced from suitable conductive metals such as plated bronze or the like, as are known to those skilled in the art.

Push-in connectors 58, 60 and 62, all having deflectable locking portions, are provided on the plug 34 for attaching the plug 34 to main circuit board 38, in cooperating aligned position with the connector 32. The connection provided by push-in connectors 58, 60 and 62 is movable to allow a predetermined limited movement of the plug 34 for final alignment between the plug 34 and connector 32.

Figure 3:
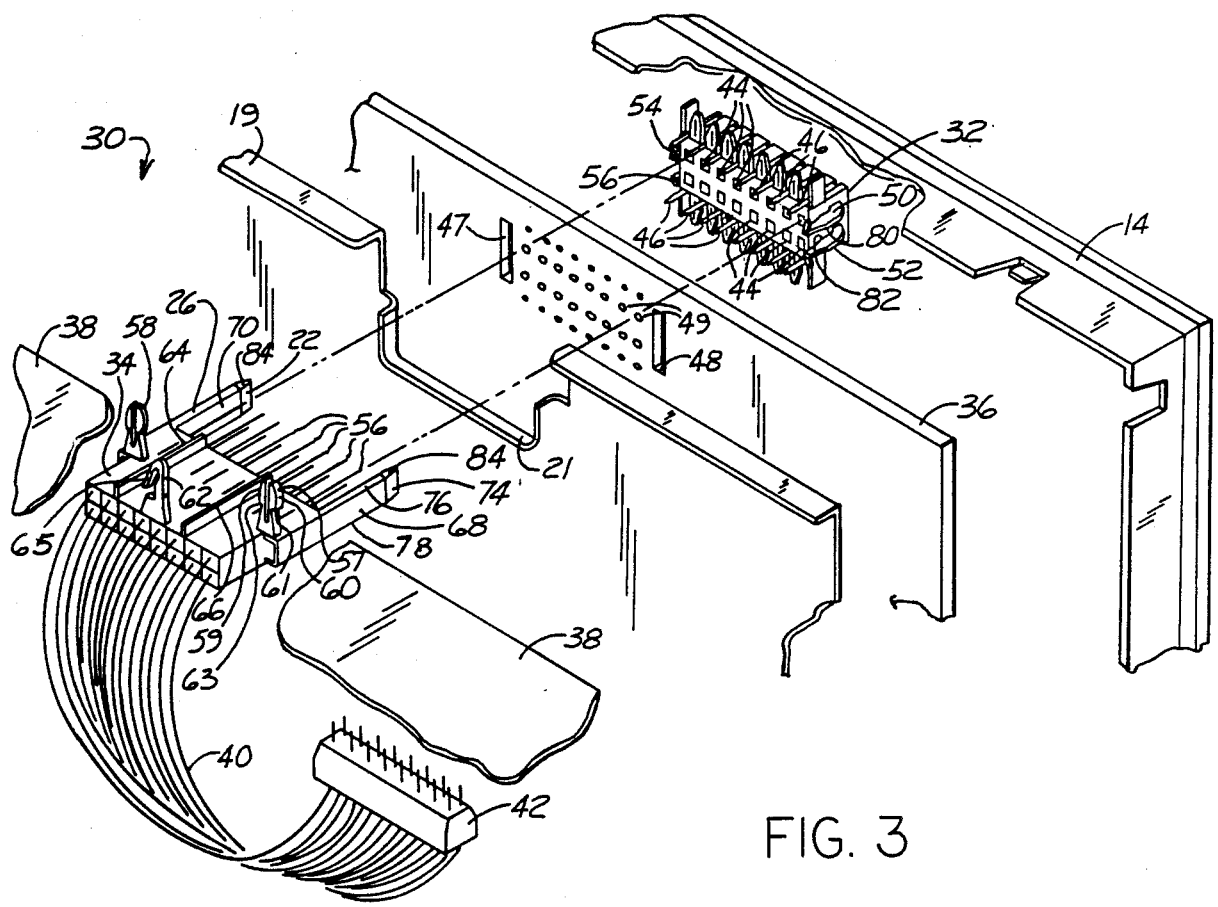
FIG. 3 is an exploded perspective view showing the connector assembly made in accordance with the teachings of the present invention.
Figure 4:
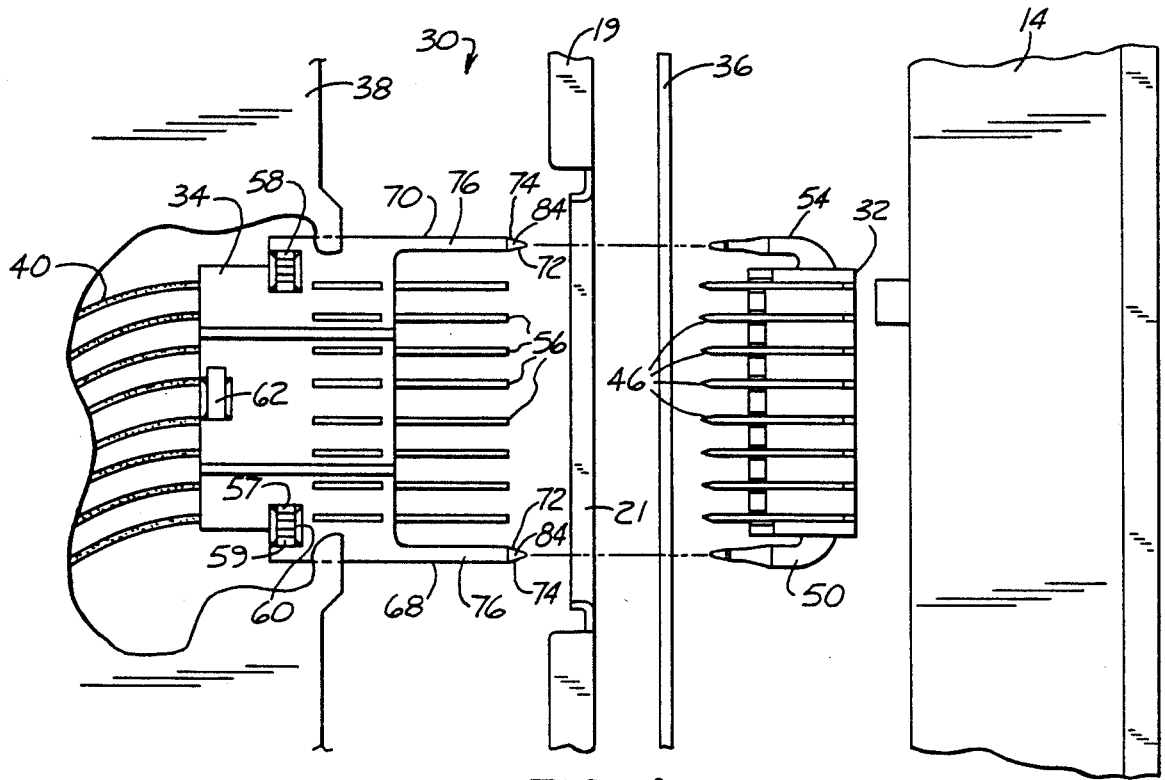
FIG. 4 is a detailed exploded top view showing the connector assembly of the present invention.

The connectors 58 and 60 are of like configuration. Referring to FIG. 3 and specifically, push-in connector 60, push-in connectors 58, 60, include a pair of deflectable arms, 57 and 59 which form respective locking surfaces 61 and 63. The circuit board 38 includes apertures (not shown) of a size such that the pair of arms 57 and 59 flex toward each other during insertion of the push-in connectors 58 and 60 into the apertures and thereafter, snap into position for locking the connector 60 to the circuit board 38.

The connector 62 includes a free flexible arm 65 which forms a generally "V" shaped push-in connector. In operation, the arm 65 is flexible such that upon insertion of the push-in connector 62 into a suitable aperture, the arm will compress inward to clear the aperture and will extend outward again after clearing the aperture to lock the arm in position. Rib members 64 and 66 are provided to generally provide a parallel relationship between the board 38 and the plane of the connector 34. Alignment blades 68 and 70 are provided on the connector 34.

The blades 68 and 70 include slanted surfaces 72 and 74 which act to center the blades in slots 46 and 48 if the plug connector 34 is out of alignment with the slots during assembly. Each blade also includes upper 76 and lower 78 parallel surfaces which cooperate with parallel surfaces 80 and 82 on connector arms 50,52 and 54,56 to provide horizontal plane alignment between the plug 34 and the connector 32. The blades also include inclined surfaces 84 and 86 which act to center the blades vertically in the slots 46 and 48.

Figure 5:
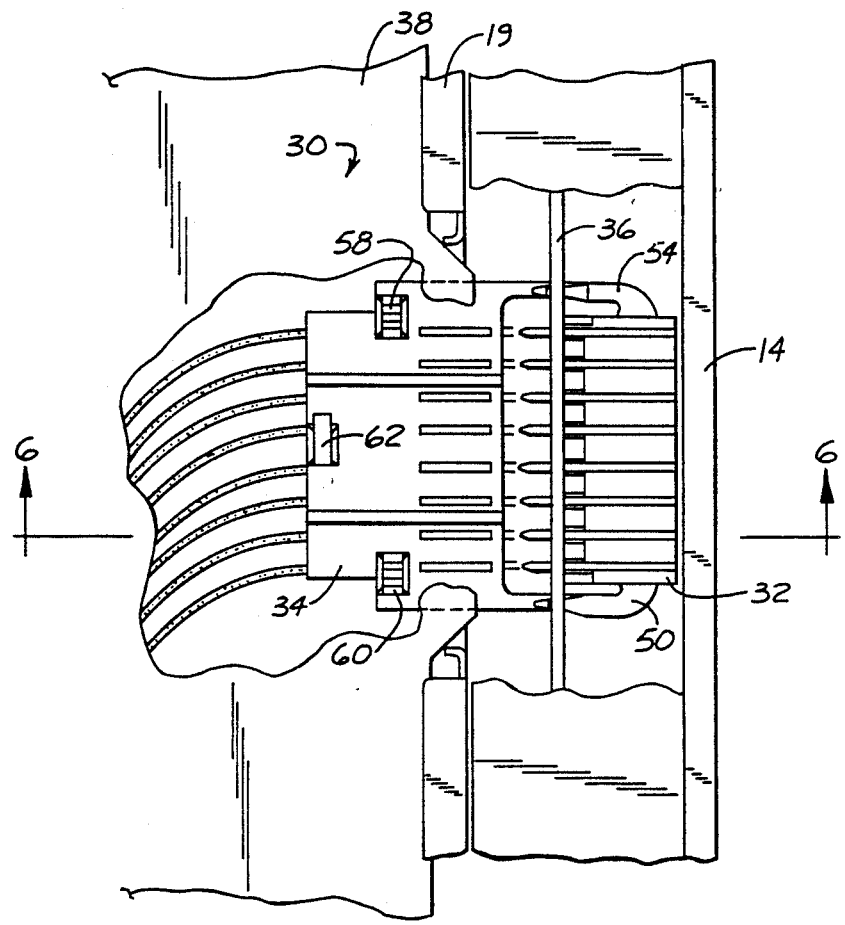
FIG. 5 is a detailed top view of the partially assembled vehicle radio showing the connector assembly of the present invention in its connected orientation.
Figure 6:
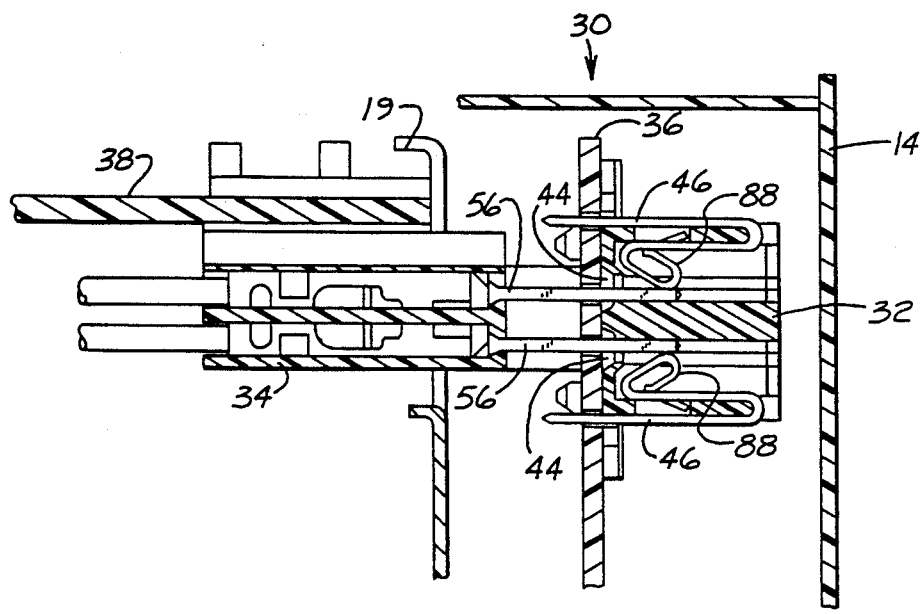
FIG. 6 is a cross sectional view taken along line 4—4 of FIG. 5 showing the connector assembly of the present invention in its connected orientation.

Thus, in operation, the combination of the connection members 58, 60 and 62 engaging the circuit board 38 and the grooves 58 generally align the connection plug 34 in cooperating relation with the connector receptacle 32 prior to assembly of the circuit boards together in the radio. When the circuit board 38 is moved towards the circuit board 36 in the automated assembly, the predetermined limited movement of the plug 34 allows the alignment blades 68 and 70 to center in the slots 47 and 48 and the spaced parallel surfaces 80 and 82 of the connecting arms 50,52 and 54,56. After initial alignment the circuit boards 36 and 38 continue to move towards one another. The parallel surfaces 76 and 78 of the blades provide for final alignment of the connectors during this continued movement and prior to the connection blades 56 engaging the sockets 44 of the receptacle 32. Thereafter, the boards are moved into final position and the connector aligns itself and is readily inserted into the circuit board into it final connected position as shown in FIGS. 5 and 6. Thus, connection between connection blades 56 and the pins 46 is facilitated by way of spring clips 88 engaging the connection blades 56.

Also provided for in the present invention is a method for providing an automated connection between a horizontal printed circuit board and a vertical printed circuit board during assembly of a vehicle radio 10. The receptacle 32 is first attached to the escutcheon PC boards 36. The escutcheon PC board is thereafter placed into the escutcheon face plate 14. The cable plug assembly 34 is then attached to the main PC board 38 which is attached to the top plate 18 of the body portion 12 of the partially assembled radio 10. The escutcheon face plate and the body portion are then aligned for assembly with the receptacle 32 generally aligned with the plug 34. The escutcheon face plate portion 19 and the body portion 12 are moved toward one another in alignment. During this movement the alignment blades 68 and 70 engage the alignment surfaces (80,82) of the arms (50,52) of the receptacle for final alignment thereof While the invention has been described in an illustrative manner it is to be understood that the terminology which has been used is intended to be that of description rather than of limitation. Obviously, many modifications and variations of the present invention are possible in light of the above teachings. It is therefore to be understood that within the scope of the appended claims, the invention may be practiced otherwise than as specifically described.

We claim:

1. In a vehicle radio having a first printed circuit board and a second printed circuit board disposed perpendicularly to one another, a connection assembly for allowing automated circuit connections between the boards, said connection assembly comprising:

a receptacle said receptacle including connection receiving sockets operably connected to a circuit of said first printed circuit board;

means for attaching said receptacle in a predetermined position on said first printed circuit board;

a plug member including a connection blade portion compatible with said sockets of said receptacle for providing electrical connection therebetween, means for attaching said plug to said second printed circuit board in a predetermined cooperating position substantially aligned with said position of said receptacle and for providing a predetermined limited movement of said plug for alignment adjustment during assembly of the first and second printed circuit boards;

alignment blade means extending from said cable assembly plug substantially parallel to the plane of the second printed circuit board; and means associated with said receptacle for receiving said alignment blade means for automatically orienting said plug such that said connection blade portions and said receiving sockets are in alignment when said first circuit board is brought together with said second circuit board during assembly thereof.

2. The assembly of claim 1 wherein said means for attaching said receptacle includes a vertically spaced pair of flexible locking arms for insertion into a slot in said first board said spaced pair of locking arms defining a spaced pair of parallel alignment surfaces;

said alignment blade means further comprises at least one alignment blade having upper and lower parallel surface for engaging said spaced pair of parallel surfaces of said locking arms during relative movement of said receptacle and said cable assembly plug for aligning said socket and said connection blades in response to relative movement of the receptacle and the plug towards one another.

3. The assembly of claim 2 wherein said at least one alignment blade includes a pair of slanted surfaces at the terminal end thereof for initial horizontal aligning of the alignment blade with respect to the locking arms.

4. The assembly of claim 2 wherein said at least one alignment blade includes a pair of inclined surfaces at the terminal end thereof for initial aligning of the blade vertically with respect to said spaced pair of parallel alignment surfaces.

5. The assembly of claim 4 wherein said at least one alignment blade includes a pair of slanted surfaces at the terminal end thereof for initial horizontal aligning of the alignment blade with respect to the locking arms.

6. An assembly for a vehicle radio comprising:
  a housing having a body portion including a top plate;
  an escutcheon face plate attached to said body portion;
  a main printed circuit board attached to said top plate;
  an escutcheon printed circuit board attached to said escutcheon face plate, said escutcheon printed circuit board being substantially perpendicular to said main printed circuit board, said escutcheon printed circuit board including a pair of laterally spaced slots therethrough, and a plurality of connection apertures between said slots;
  a receptacle connection attached to said circuit board, said receptacle including a plurality of connection sockets aligned with said connection apertures in its attached position, said receptacle also including laterally spaced pairs of vertically spaced locking arms extending into said slots, each of said pairs of locking arms including parallel alignment surfaces extending substantially perpendicularly to said escutcheon board;
  a cable connector plug attached to said main circuit board such that predetermined limited movement of the cable connector plug is provided, said cable connector plug including a plurality of connection blades for connection with said plurality of connection sockets of said receptacle, said cable connector plug including a pair of laterally spaced alignment blades extending from the peripheral edge of the circuit board, each of said pair of alignment blades having a pair of vertically spaced parallel external surfaces wherein said alignment blades are operable for engaging said parallel alignment surfaces of said receptacle in response to respective movement of said main circuit board toward said escutcheon circuit board for providing alignment of said cable connector plug with said receptacle connection for aligning of said connection blades with said connection sockets during final assembly of said escutcheon board and said main circuit board.

7. The assembly of claim 6 wherein said alignment blades include a pair of inclined surfaces at the terminal end thereof the acting to initially align said alignment blades vertically with respect to said vertically spaced locking arms and a pair of horizontally slanted surfaces at the terminal end of each of said alignment blades for acting to initially align the alignment blades horizontally in said slots.

8. A method of providing an automated connection between perpendicularly disposed first and second printed circuit boards during assembly of a vehicle radio, said vehicle radio including a body portion having a first printed circuit board attached thereto and a face plate portion having a means for securing a second printed circuit board thereto, said body portion and said face plate being adapted for automated assembly together such that said first printed circuit board and said second printed circuit board are substantially perpendicular to one another, said method comprising the steps of:
  a. attaching a receptacle connector to said second printed circuit board;
  b. placing said second circuit board in said face plate portion;
  c. attaching a cable plug assembly to said first printed circuit board, said cable plug assembly being moveable with respect to said first circuit board to a predetermined limited extent, said plug including alignment blade means, and said receptacle including a means for receiving said alignment blade means;
  d. aligning said body portion with said face plate portion, wherein said receptacle is generally aligned with said connector plug; and
  e. assembling said face plate portion to said body portion by moving them towards each other in aligned position wherein said plug moves into final alignment with said receptacle by said alignment blade means engaging said means for receiving said alignment blade means in response to the movement of said body portion and said face plate portion.

* * * * *